(12) United States Patent
Zhang et al.

(10) Patent No.: US 12,278,299 B1
(45) Date of Patent: Apr. 15, 2025

(54) SOLAR CELL, METHOD FOR PREPARING THE SAME AND PHOTOVOLTAIC MODULE

(71) Applicant: JINKO SOLAR (HAINING) CO., LTD., Haining (CN)

(72) Inventors: Bike Zhang, Haining (CN); Bo Zhang, Haining (CN); Jingsheng Jin, Haining (CN); Mengwei Xu, Haining (CN); Jiani Qin, Haining (CN)

(73) Assignee: JINKO SOLAR (HAINING) CO., LTD., Zhejiang (CN)

( * ) Notice: Subject to any disclaimer, the term of this patent is extended or adjusted under 35 U.S.C. 154(b) by 0 days.

(21) Appl. No.: 18/407,363

(22) Filed: Jan. 8, 2024

(30) Foreign Application Priority Data

Oct. 9, 2023 (CN) .......................... 202311297963.8

(51) Int. Cl.
*H01L 31/0352* (2006.01)
*H01L 31/18* (2006.01)
*H01L 31/068* (2012.01)

(52) U.S. Cl.
CPC .... *H01L 31/03529* (2013.01); *H01L 31/1804* (2013.01); *H01L 31/068* (2013.01)

(58) Field of Classification Search
None
See application file for complete search history.

(56) References Cited

U.S. PATENT DOCUMENTS

| | | |
|---|---|---|
| 2023/0050761 A1 | 2/2023 | Yu et al. |
| 2023/0088548 A1 | 3/2023 | Yu et al. |

FOREIGN PATENT DOCUMENTS

| | | | | |
|---|---|---|---|---|
| AU | 2021225144 B1 | * | 6/2022 | ....... H01L 31/02167 |
| CN | 103843150 A | | 6/2014 | |
| CN | 104350607 A | | 2/2015 | |
| CN | 109638088 A | | 4/2019 | |
| CN | 214477490 U | | 10/2021 | |
| CN | 114628252 A | | 6/2022 | |
| CN | 114823951 A | * | 7/2022 | |
| CN | 115020503 A | | 9/2022 | |

(Continued)

OTHER PUBLICATIONS

English machine translation of Jin (CN-114823951-A) provided by the EPO website, All Pages, 2024. (Year: 2024).*

(Continued)

*Primary Examiner* — Daniel P Malley, Jr.
(74) *Attorney, Agent, or Firm* — USCH Law, PC

(57) ABSTRACT

Embodiments of the present disclosure relate to the field of solar cell technologies, and provide a solar cell, a method for preparing the same, and a photovoltaic module. The solar cell includes an N-type silicon substrate including a front surface and a rear surface opposite to the front surface. The front surface includes a plurality of pyramid structures, the rear surface includes a plurality of grooves, and some of the plurality of grooves are sequentially arranged along one arrangement direction. The solar cell includes a passivation layer formed over the front surface, a tunneling dielectric layer formed over the rear surface, and a doped conductive layer formed over the tunneling dielectric layer. Embodiments of the present disclosure at least help improve the photoelectric conversion efficiency of the solar cell by changing a morphology of the rear surface of the N-type silicon substrate.

11 Claims, 6 Drawing Sheets

(56) References Cited

FOREIGN PATENT DOCUMENTS

| | | | |
|---|---|---|---|
| CN | 115347063 | A | 11/2022 |
| CN | 110855229 | B | 2/2023 |
| CN | 116705870 | A | 9/2023 |
| CN | 116722051 | A | 9/2023 |
| JP | 2016514901 | A | 5/2016 |
| JP | 2017028292 | A | 2/2017 |
| JP | 2017076826 | A | 4/2017 |
| JP | 2018129511 | A | 8/2018 |
| JP | 2021185625 | A | 12/2021 |
| JP | 2023024204 | A | 2/2023 |
| KR | 20140021125 | A | 2/2014 |
| WO | 2013098955 | A1 | 7/2013 |
| WO | 2015122257 | A1 | 8/2015 |
| WO | 2022211729 | A1 | 10/2022 |

OTHER PUBLICATIONS

Jinko Solar (Haining) Co., Ltd., CN First Office Action with English translation, CN 2023112979638, Nov. 28, 2023, 12 pgs.

Jinko Solar (Haining) Co., Ltd., Extended European Search Report, EP 23220221.8, Jun. 11, 2024, 12 pgs.

* cited by examiner

SOLAR CELL, METHOD FOR PREPARING THE SAME AND PHOTOVOLTAIC MODULE

CROSS REFERENCE TO RELATED APPLICATIONS

This application claims priority to Chinese Patent Application No. CN202311297963.8, filed on Oct. 9, 2023, which is incorporated by reference herein in its entirety.

TECHNICAL FIELD

The various embodiments described in this document relate in general to the field of solar cell technologies, and more specifically to a solar cell, a method for preparing the same and a photovoltaic module.

BACKGROUND

At present, as fossil fuels are gradually exhausted, solar cells have wider applications as a new energy alternative solution. A solar cell is an apparatus that converts light energy of the sun into electric energy. The solar cell generates carriers by using a photovoltaic effect principle and introduces the carriers out by using an electrode, which is conducive to effective utilization of the electric energy.

Existing solar cells mainly include an interdigitated back contact (IBC) cell, a tunnel oxide passivated contact (TOP-CON) cell, a passivated emitter and real cell (PERC), a heterojunction with intrinsic thin-layer (HIT) cell, and the like.

However, to improve the photoelectric conversion efficiency of the solar cell, a surface morphology of a film layer in the solar cell needs to be further addressed.

SUMMARY

Embodiments of the present disclosure provide a solar cell, a method for preparing the same and a photovoltaic module, which at least facilitates improving the photoelectric conversion efficiency of the solar cell by changing morphology of a rear surface of an N-type silicon substrate.

According to some embodiments of the present disclosure, an aspect of the embodiments of the present disclosure provides a solar cell. The solar cell includes an N-type silicon substrate, including a front surface and a rear surface opposite to the front surface. The front surface includes a plurality of pyramid structures, the rear surface includes a plurality of grooves, and some grooves of the plurality of grooves are sequentially arranged along one arrangement direction. The solar cell includes a passivation layer formed over the front surface, a tunneling dielectric layer formed over the rear surface, and a doped conductive layer formed over the tunneling dielectric layer.

In some embodiments, the plurality of grooves include N groove groups, any one of the N groove groups includes grooves arranged sequentially in a corresponding arrangement direction, arrangement directions of some groove groups of the N groove groups are the same, while arrangement directions of some groove groups of the N groove groups are different, and N is a positive integer greater than or equal to 2.

In some embodiments, at least two first groove groups of the N groove groups are next to each other and spaced apart from each other by an interval, and at least two second groove groups of the N groove groups overlap with each other by an overlapping region.

In some embodiments, at least two first grooves of the plurality of grooves are next to each other and spaced apart from each other by an interval, and at least two second grooves of the plurality of grooves overlap with each other by an overlapping region.

In some embodiments, in a direction away from the rear surface, a single groove of the plurality of grooves includes a bottom surface, a top opening opposite to the bottom surface, and a side wall located between the bottom surface and the top opening, and an area of an orthographic projection of the bottom surface on the N-type silicon substrate is less than an area of an orthographic projection of the top opening on the N-type silicon substrate.

In some embodiments, an orthographic projection of a single groove of the plurality of grooves on the N-type silicon substrate is in a shape of polygon with M sides, and M is a positive integer greater than or equal to 3.

In some embodiments, in a direction away from the rear surface, a single groove of the plurality of grooves includes a top opening, and a size of the top opening ranges from 1 μm to 20 μm in any one dimension.

In some embodiments, a distribution density of the plurality of grooves on the rear surface ranges from $1000/mm^2$ to $50000/mm^2$.

In some embodiments, in a direction away from the rear surface, a maximum value of a depth of a single groove of the plurality of grooves ranges from 50 nm to 2000 nm.

In some embodiments, the doped conductive layer includes N-type doping elements, and the doped conductive layer is formed over a surface of the tunneling dielectric layer facing away from the N-type silicon substrate.

In some embodiments, the doped conductive layer includes P-type doping elements, and the doped conductive layer is formed over a surface of the tunneling dielectric layer facing away from the N-type silicon substrate.

In some embodiments, the doped conductive layer includes a first part and a second part that are spaced apart, one of the first part and the second part includes doping elements of a same conductive type as that of the N-type silicon substrate, and the other of the first part and the second part includes doping elements of a conductive type different from that of the N-type silicon substrate.

According to some embodiments of the present disclosure, another aspect of the embodiments of the present disclosure provides a method for preparing a solar cell. The method includes: providing an initial N-type silicon substrate including a first surface and a second surface opposite to the first surface, subjecting the initial N-type silicon substrate to texturing processing to form pyramid structures on both the first surface and the second surface, subjecting the second surface to first etching processing to form initial grooves, subjecting the second surface to second etching processing to increase sizes of the initial grooves to form an N-type silicon substrate including grooves, where some of the grooves are sequentially arranged along one arrangement direction, and an etching rate of the first etching processing on the second surface is less than an etching rate of the second etching processing on the second surface, the first surface on which the pyramid structures are formed serves as a front surface of the N-type silicon substrate, and the second surface subjected to the first etching processing and the second etching processing serves as a rear surface of the N-type silicon substrate, forming a tunneling dielectric layer over the rear surface of the N-type silicon substrate and forming a doped conductive layer over a surface of the tunneling dielectric layer facing away from the N-type silicon substrate.

In some embodiments, the second surface is subjected to the first etching processing by immersing the initial N-type silicon substrate in a first etching solution, the second surface is subjected to the second etching processing by immersing the initial N-type silicon substrate in a second etching solution, and a mass fraction of sodium hydroxide in the first etching solution is less than or equal to a mass fraction of sodium hydroxide in the second etching solution.

In some embodiments, the first etching solution and the second etching solution each include a protective agent, and a mass fraction of the protective agent in the first etching solution is less than a mass fraction of the protective agent in the second etching solution.

In some embodiments, an ambient temperature during the first etching processing is a first temperature, an ambient temperature during the second etching processing is a second temperature, and the first temperature is lower than the second temperature.

In some embodiments, duration of the first etching processing is a first time length, duration of the second etching processing is a second time length, and the first time length is greater than or equal to the second time length.

According to some embodiments of the present disclosure, another aspect of the embodiments of the present disclosure further provides a photovoltaic module, including: a cell string, formed by connecting the solar cells as described above or formed by connecting solar cells produced by using the method as described above, an encapsulation glue film, configured to cover a surface of the cell string, and a cover plate, configured to cover a surface of the encapsulation glue film facing away from the cell string.

The technical solutions provided in the embodiments of the present disclosure have the following advantages.

In the N-type silicon substrate, different from the typical pyramid structures included on the front surface, the rear surface does not include the pyramid structures that protrude relatively but includes a plurality of grooves. In this way, on one hand, compared with the pyramid structure with a sharp top, the rear surface including a plurality of grooves is flatter, which helps improve the film layer uniformity of the tunneling dielectric layer and the doped conductive layer formed on the rear surface, thereby improving a passivation effect of the tunneling dielectric layer and the doped conductive layer on the N-type silicon substrate. On the other hand, the rear surface including the plurality of grooves also helps improve a specific surface area of the N-type silicon substrate, to improve specific surface areas of the tunneling dielectric layer and the doped conductive layer, thereby improving contact areas between an electrode and the doped conductive layer as well as the tunneling dielectric layer, reducing contact resistance between the electrode and the doped conductive layer as well as the tunneling dielectric layer, and improving the collection efficiency of the electrode for carriers. Therefore, combining the two aspects helps improve a short-circuit voltage and the photoelectric conversion efficiency of the solar cell.

BRIEF DESCRIPTION OF THE DRAWINGS

One or more embodiments are described by way of example with reference to the corresponding figures in the accompanying drawings, and the exemplary description is not to be construed as limiting the embodiments. Elements in the accompanying drawings that have same reference signs are represented as similar elements, and unless otherwise particularly stated, the figures in the accompanying drawings are not drawn to scale. To describe the technical solutions of the embodiments of the present disclosure or the related art more clearly, the accompanying drawings that need to be used in the embodiments are briefly described below. Apparently, the accompanying drawings in the following description show only some embodiments of the present disclosure, and a person of ordinary skill in the art may still derive other drawings from these accompanying drawings without creative efforts.

DETAILED DESCRIPTION OF THE EMBODIMENTS

Figure 1:
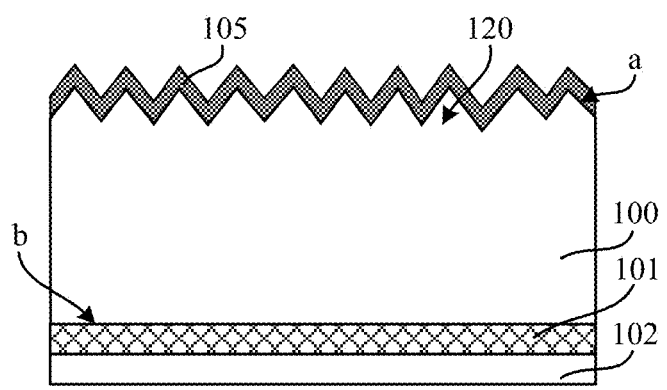
FIG. 1 is a schematic diagram illustrating a cross-sectional view of a partial structure of a solar cell according to an embodiment of the present disclosure.

As can be known from the background that, the photoelectric conversion efficiency of a solar cell needs to be improved.

It is found through analysis that a tunnel oxide layer and a heavily doped n-type polycrystalline silicon layer are disposed on a rear surface of an N-type TOPCON crystalline silicon solar cell, to form a tunnel oxide passivated contact structure. The passivation performance and a metal electrode contact effect of a film layer structure of the solar cell greatly depend on a rear surface of a substrate structure, and existing rear surfaces of the substrate structure mainly include morphology such as a textured surface, an acid polished surface, and an alkali polished surface, and the morphology has the following problems.

For the textured surface, a specific surface area of the textured surface is great. Due to this excellent morphology feature, an electrode paste is easily sintered, so that a good ohmic contact is formed between an electrode and the substrate structure, and the textured surface is advantageous in reducing a contact resistivity between the electrode and the substrate structure. However, the large specific surface area of the textured surface may easily lead to a large quantity of recombination sites on the rear surface of the substrate structure, that is, a large number of recombination centers are provided for carriers, leading to a decrease in the collection efficiency of the electrode for the carriers. In addition, the tunnel oxide layer can be hardly uniformly distributed on the textured surface, leading to a poor passivation effect of the rear surface.

For the acid polished surface, mixed acid processing of hydrofluoric acid and nitric acid is performed on the textured surface, to form a structure with a polished top similar to a pyramid structure, so that the passivation effect is improved by reducing the specific surface area to some extent. However, the contact resistivity between the electrode and the substrate structure is increased significantly, and high acid costs limit further promotion of the acid polished surface.

For the alkali polished surface, based on the textured surface, pyramid structures on the rear surface are removed by using an alkali polishing solution to form a square mesh structure, so that the specific surface area is reduced significantly, but an extremely high rear passivation effect makes up for a disadvantage of a decrease in the resistivity to some extent, and as development of an electrode paste for the alkali polished surface, the rear contact disadvantage is further alleviated. However, how to further optimize a morphology of the rear surface of the substrate structure to improve the contact performance between the electrode and the substrate structure while ensuring the passivation performance of the rear surface is a problem that needs to be resolved urgently.

Embodiments of the present disclosure provide a solar cell, a method for preparing the same and a photovoltaic module. In the solar cell, on one hand, compared with a pyramid structure with a sharp top, a rear surface including a plurality of grooves is flatter, which facilitates improving the film layer uniformity of a tunneling dielectric layer and a doped conductive layer formed over a rear surface, thereby improving a passivation effect of the tunneling dielectric layer and the doped conductive layer on an N-type silicon substrate. On the other hand, the rear surface including the plurality of grooves also facilitates improving a specific surface area of the N-type silicon substrate, to improve specific surface areas of the tunneling dielectric layer and the doped conductive layer, thereby improving contact areas between an electrode and the doped conductive layer as well as the tunneling dielectric layer, reducing contact resistance between the electrode and the doped conductive layer as well as the tunneling dielectric layer, and improving the collection efficiency of the electrode for carriers. Therefore, combining the two aspects is conducive to improving a short-circuit voltage of the solar cell and improving the photoelectric conversion efficiency of the solar cell.

The following describes the embodiments of the present disclosure in detail with reference to the accompanying drawings. However, a person of ordinary skill in the art may understand that, in the embodiments of the present disclosure, many technical details are provided for better understanding of the embodiments of the present disclosure. However, the technical solutions claimed to be protected by the embodiments of the present disclosure may also be implemented even without the technical details and various changes and modifications based on the following embodiments.

An embodiment of the present disclosure provides a solar cell, and the solar cell provided in the embodiment of the present disclosure is described below in detail with reference to the accompanying drawings.

Referring to FIG. 1 to FIG. 5, the solar cell includes: an N-type silicon substrate 100, where the N-type silicon substrate 100 includes a front surface a and a rear surface b that are opposite to each other; the front surface a includes a plurality of pyramid structures 120; and the rear surface b includes a plurality of grooves 110, and a portion of the plurality of grooves 110 are sequentially arranged along one arrangement direction; a passivation layer 105 formed over the front surface a; a tunneling dielectric layer 101 formed over the rear surface b; and a doped conductive layer 102 formed over the tunneling dielectric layer 101.

Figure 2:
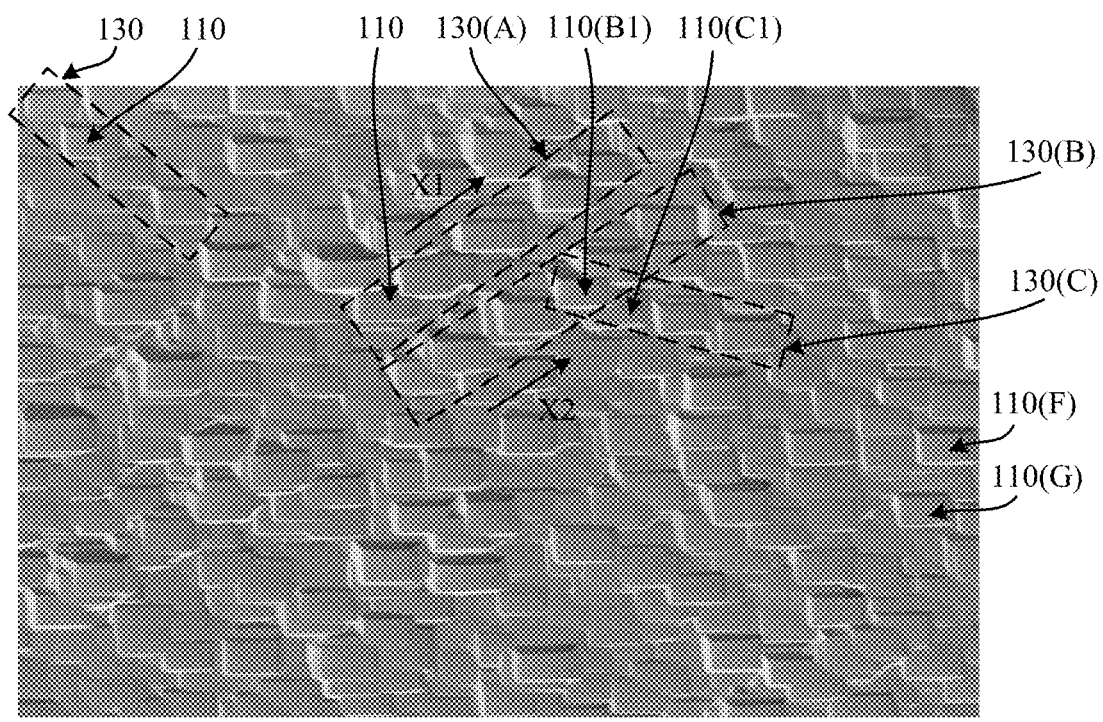
FIG. 2 is a schematic diagram illustrating a scanning electron micrograph of a local rear surface of an N-type silicon substrate according to an embodiment of the present disclosure.
Figure 3:
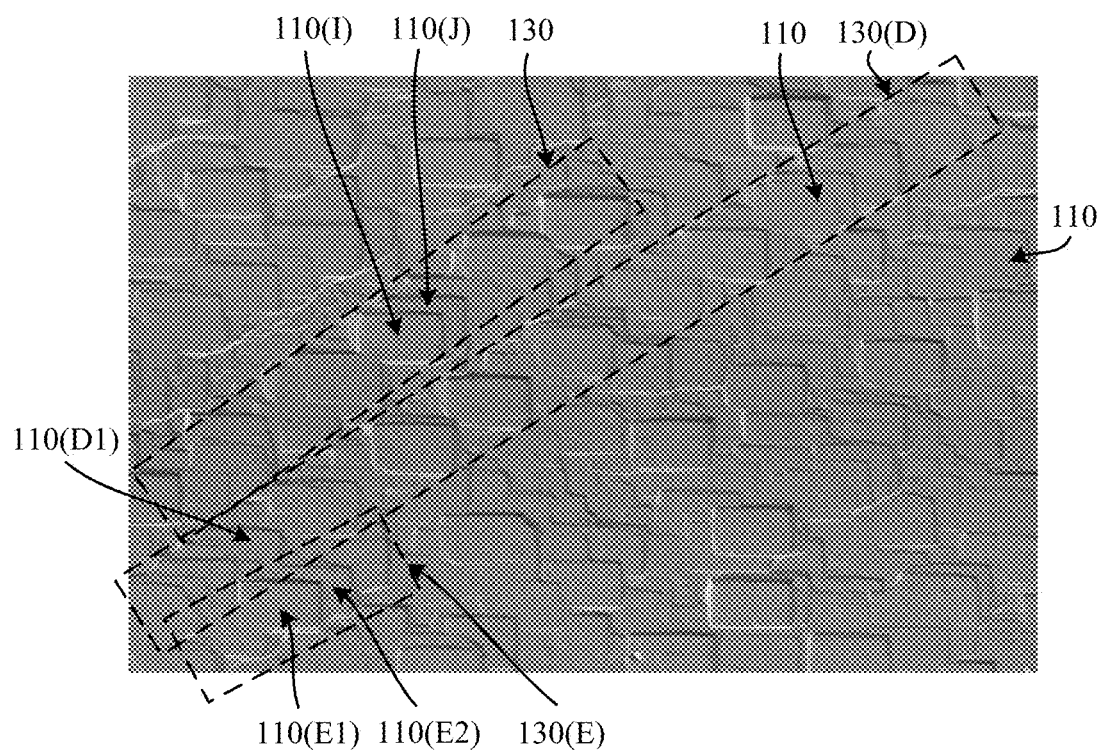
FIG. 3 is another schematic diagram illustrating a scanning electron micrograph of a local rear surface of an N-type silicon substrate according to an embodiment of the present disclosure.
Figure 4:
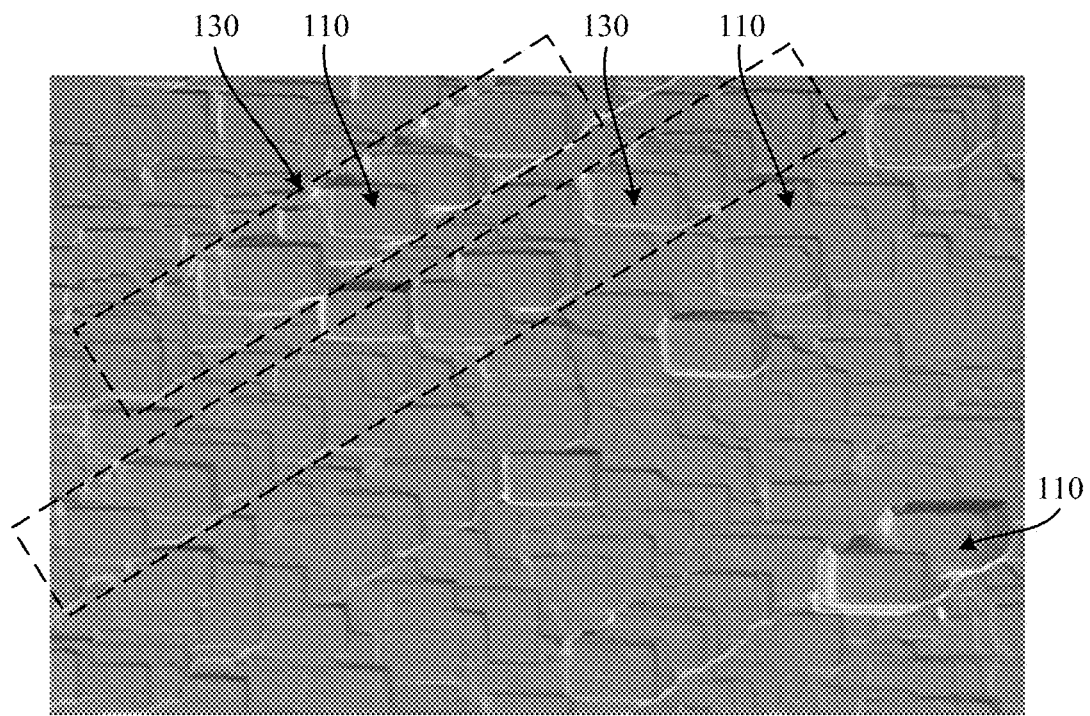
FIG. 4 is still another schematic diagram illustrating a scanning electron micrograph of a local rear surface of an N-type silicon substrate according to an embodiment of the present disclosure.
Figure 5:
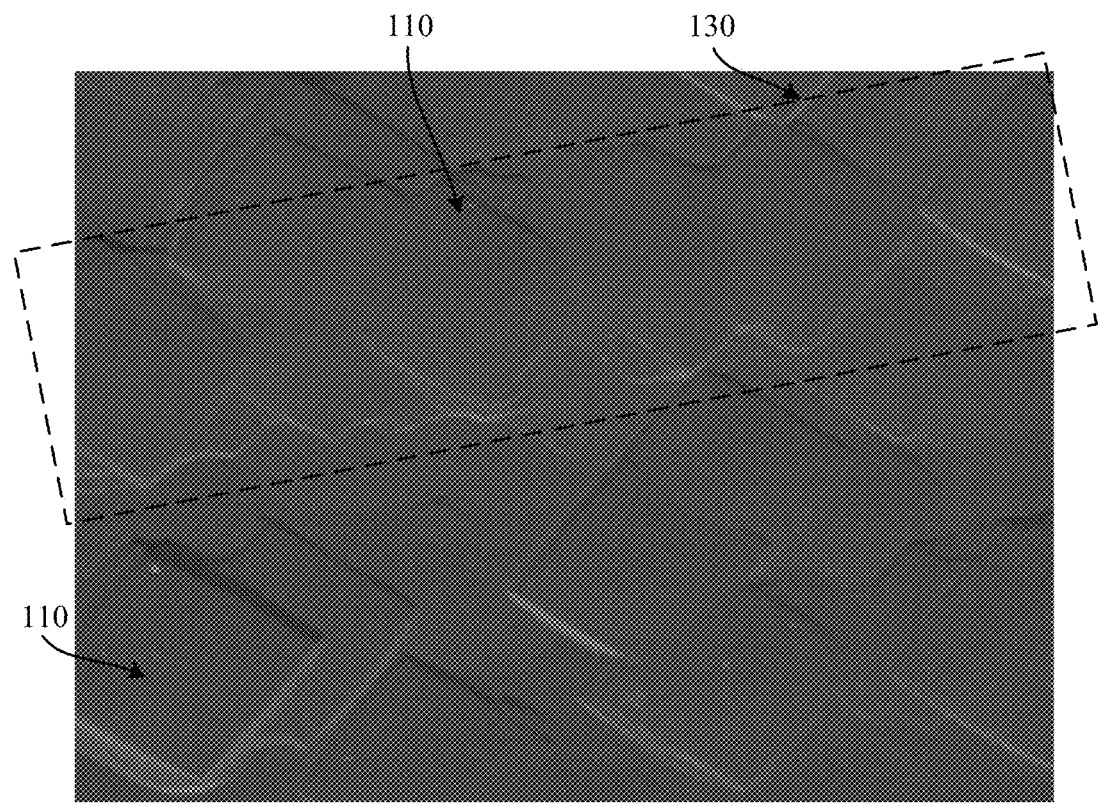
FIG. 5 is yet another schematic diagram illustrating a scanning electron micrograph of a local rear surface of an N-type silicon substrate according to an embodiment of the present disclosure.

It should be noted that, FIG. 1 is a schematic diagram illustrating a cross-sectional view of a partial structure of a solar cell according to an embodiment of the present disclosure, and since a size of a single groove 110 is relatively small, the grooves 110 on the rear surface b are not shown in FIG. 1. FIG. 2 is a schematic diagram illustrating a scanning electron micrograph (SEM) of a rear surface of an N-type silicon substrate according to an embodiment of the present disclosure. FIG. 3 is another schematic diagram illustrating a scanning electron micrograph (SEM) of a rear surface of an N-type silicon substrate according to an embodiment of the present disclosure. FIG. 4 is still another schematic diagram illustrating a scanning electron micrograph (SEM) of a rear surface of an N-type silicon substrate according to an embodiment of the present disclosure. FIG. 5 is yet another schematic diagram illustrating a scanning electron micrograph (SEM) of the rear surface b of the N-type silicon substrate 100 according to an embodiment of the present disclosure.

Figure 6:
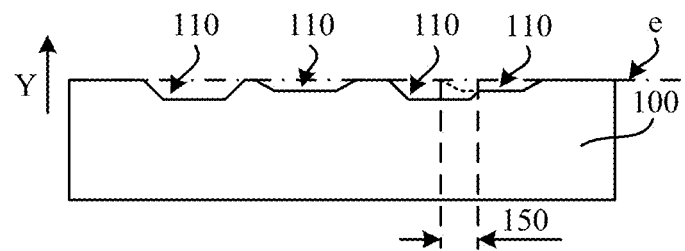
FIG. 6 is a schematic diagram illustrating a cross-sectional view of a partial structure of an N-type silicon substrate according to an embodiment of the present disclosure.

In some cases, in the N-type silicon substrate 100, different from the typical pyramid structures included on the front surface a, for a horizontal plane e in which the rear surface b is located (referring to FIG. 6), the rear surface b does not include the pyramid structures that protrude relative to the horizontal plane e but includes a plurality of grooves 110 that are recessed relative to the horizontal plane. It should be noted that, the horizontal plane e in which the rear surface b is located refers to a plane in which most surface of the entire rear surface b other than the grooves 110 is located for the entire N-type silicon substrate 100. FIG. 6 shows the horizontal plane e by using a dot dash line, and the horizontal plane e shown in FIG. 6 is merely an example.

In this way, on one hand, compared with the pyramid structure with a sharp top, the rear surface b including a plurality of grooves 110 is flatter, which facilitates improving the film layer uniformity of the tunneling dielectric layer 101 and the doped conductive layer 102 formed over the rear surface b, thereby improving a passivation effect of the tunneling dielectric layer and the doped conductive layer on the N-type silicon substrate 100. On the other hand, the rear surface b including the plurality of grooves 110 also facilitates improving a specific surface area of the N-type silicon substrate 100, to improve specific surface areas of the tunneling dielectric layer 101 and the doped conductive layer 102, thereby improving contact areas between an electrode and the doped conductive layer 102 as well as the tunneling dielectric layer 101, reducing contact resistance between the electrode and the doped conductive layer 102 as well as the tunneling dielectric layer 101, and improving the collection efficiency of the electrode for carriers. Therefore, combining the two aspects facilitates improving a short-circuit voltage of the solar cell and improving the photoelectric conversion efficiency of the solar cell.

It should be noted that, the electrode, the doped conductive layer 102, and the tunneling dielectric layer 101 may be described in detail below.

The embodiments of the present disclosure are described in more detail below with reference to the accompanying drawings. In some embodiments, referring to FIG. 2 to FIG. 5, the plurality of grooves 110 include N groove groups 130, any one groove group of the N groove groups 130 includes a plurality of grooves 110 arranged sequentially in one arrangement direction, arrangement directions of the plurality of grooves 110 in different groove groups 130 are the same or different, and N is a positive integer greater than or equal to 2.

In other words, for any groove group 130, the plurality of grooves 110 belonging to the groove group 130 are sequentially arranged in the same direction, which facilitates enhancing the change regularity of a morphology of the rear surface b, and further improving the film layer uniformity of the tunneling dielectric layer 101 and the doped conductive layer 102 formed over the rear surface b, thereby improving a passivation effect of the tunneling dielectric layer and the doped conductive layer on the N-type silicon substrate 100.

In addition, for different groove groups 130, the arrangement directions of the grooves 110 belonging to the different groove groups 130 may be the same or may be different. In an example, referring to FIG. 2, one groove group 130 is marked as 130(A), another groove group 130 is marked as 130(B), an arrangement direction of the plurality of grooves 110 in the groove group 130(A) is X1, an arrangement direction of the plurality of grooves 110 in the groove group 130(B) is X2, and the direction X1 is different from the direction X2, that is, the direction X1 intersects with the direction X2. During actual application, the direction X1 may alternatively be the same as the direction X2, that is, the direction X1 is parallel to the direction X2.

For a groove 110, the groove may belong to more than one grove group 130. For example, referring to FIG. 2, still another groove group is marked as 130(C), the groove group 130(B) and the groove group 130(C) both include a same groove 110, and the groove 110 is marked as 110(B1) in FIG. 2.

It should be noted that, the groove group 130 is shown by a plurality of grooves 110 framed by a dotted box in FIG. 2 to FIG. 5, and merely some groove groups 130 are shown in FIG. 2 to FIG. 5. During actual application, a quantity of the groove groups 130 on the rear surface b includes, but not limited to, the groove groups 130 shown by the dotted boxes, and any one of the plurality of groove groups 130 may be the groove group 130(A) or the groove group 130(B).

In some embodiments, referring to FIG. 2, an interval exists between adjacent groove groups 130. In other words, orthographic projections of the adjacent groove groups 130, for example, the groove group 130(A) and the groove group 130(B) in FIG. 2, on the N-type silicon substrate 100 are not overlapped. In some other embodiments, still referring to FIG. 2, an overlapping region 150 (referring to FIG. 6) exists between at least some grooves 110 in adjacent groove groups 130. In other words, orthographic projections of the adjacent groove groups 130 on the N-type silicon substrate 100 are overlapped, and the overlapped part of the orthographic projections of the adjacent groove groups 130 is an orthographic projection of the overlapping region 150 on the N-type silicon substrate 100. For example, an overlapping region 150 exists between the groove 110(B1) in the groove group 130(B) and a groove 110(C1) in the groove group 130(C) in FIG. 2. In still some other embodiments, still referring to FIG. 2, a plurality of groove groups 130 exist on the rear surface b, an interval exists between some adjacent groove groups 130, and an overlapping region 150 exists between at least some grooves 110 in some other adjacent groove groups 130.

It should be noted that, FIG. 6 is a schematic diagram illustrating a cross-sectional view of a partial structure of an N-type silicon substrate according to an embodiment of the present disclosure. In FIG. 6, an overlapped part, that is, an overlapping region 150 of two adjacent grooves 110 is shown by using dashed lines with a small interval.

In an example, referring to FIG. 2, three different groove groups 130 are marked as 130(A), 130(B), and 130(C), respectively. The groove group 130(A) and the groove group 130(B) are adjacent to each other and an interval exists between the two groove groups, and the groove group 130(B) and the groove group 130(C) are adjacent to each other and an overlapping region 150 exists between at least some grooves 110 in the groove group 130(B) and the groove group 130(C) (referring to FIG. 6).

It should be noted that, any one of the plurality of groove groups 130 may be the groove group 130(A), the groove group 130(B), or the groove group 130(C). In addition, an example in which the overlapping region 150 is a three-dimensional region is shown in FIG. 6. During actual application, two adjacent groove groups 130 are connected, and an overlapping region 150 of the two connected groove groups 130 is a line or a plane in this case.

The following describes the overlapping region 150 existing between at least some grooves 110 in adjacent groove groups 130 in detail.

In some embodiments, in two adjacent groove groups 130, one groove 110 in one groove group 130 includes an overlapping region 150 with one groove 110 in the other groove group 130. In an example, referring to FIG. 2, in the adjacent groove groups 130(B) and 130(C), one groove 110 in the groove group 130(B) is marked as 110(B1), one groove 110 in the groove group 130(C) is marked as 110(C1), and the groove 110(B1) only includes the overlapping region 150 with the groove 110(C1) (referring to FIG. 6).

In some other embodiments, in two adjacent groove groups 130, one groove 110 in one groove group 130 includes an overlapping region 150 with at least two grooves 110 in the other groove group 130. In an example, referring to FIG. 3, the two adjacent groove groups 130 are marked as 130(D) and 130(E), respectively. One groove 110 in the groove group 130(D) is marked as 110(D1), and two grooves 110 in the groove group 130(E) are marked as 110(E1) and 110(E2), respectively. The groove 110(D1) at least includes the overlapping region 150 with both the groove 110(E1) and the groove 110(E2) (referring to FIG. 6).

It should be noted that, for any groove group 130, adjacent grooves 110 in the groove group 130 may include an overlapping region 150 or may be spaced apart, and for any groove 110 in any groove group 130, the groove 110 may be spaced apart from any other groove 110, or may include an overlapping region 150 with at least one other groove 110.

In some embodiments, an interval exists between at least two of some adjacent grooves 110, for example, two grooves 110 marked as 110(F) and 110(G) respectively, as shown in FIG. 2. In some other embodiments, an overlapping region 150 exists between at least two of some adjacent grooves 110(referring to FIG. 6), for example, two grooves 110 marked as 110(I) and 110(J) respectively, as shown in FIG. 3. In still some other embodiments, an interval exists between two of some adjacent grooves 110, and an overlapping region 150 exists between two of some other adjacent grooves 110. For example, in FIG. 2, the groove 110(F) and the groove 110(G) are spaced apart from each other by an interval, and the groove 110(B1) and the groove 110(C1) overlap with each other by an overlapping region 150.

It should be noted that, two adjacent grooves 110 may belong to a same groove group 130, or two adjacent grooves 110 may belong to two adjacent groove groups 130, respectively. Alternatively, at least one of two adjacent grooves 110 is an independent groove 110, and the independent groove does not belong to any groove group 130, for example, the groove 110 marked as 110(F) in FIG. 2. In addition, an example in which an interval exists between two of some adjacent grooves 110 and an overlapping region 150 exists between two of some other adjacent grooves 110 is used in the morphology of the rear surface b shown in FIG. 2 to FIG. 5. During actual application, in the morphology of the rear surface b, an interval exists between every two adjacent grooves 110, or an overlapping region 150 exists between every two adjacent grooves 110.

Figure 7:
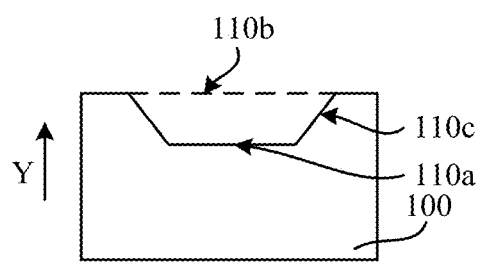
FIG. 7 is a schematic diagram illustrating a cross-sectional view of a partial structure of a single groove in an N-type silicon substrate according to an embodiment of the present disclosure.

In some embodiments, referring to FIG. 7, FIG. 7 is a schematic diagram illustrating a cross-sectional view of a partial structure of a single groove 110 in the N-type silicon substrate 100 according to an embodiment of the present disclosure. In a direction Y away from the rear surface b, the groove 110 includes a bottom surface 110*a* and a top opening 110*b* that are arranged opposite to each other and a side wall 110*c* located between the bottom surface 110*a* and the top opening 110*b*, and an area of an orthographic projection of the bottom surface 110*a* on the N-type silicon substrate 100 is less than an area of an orthographic projection of the top opening 110*b* on the N-type silicon substrate 100. In other words, in the direction away from the rear surface b, the groove 110 is a structure with a wide top and a narrow bottom, and in a cross section perpendicular to the bottom surface 110*a*, a cross-sectional shape of the groove 110 is an inverted trapezoid with a wide top and a narrow bottom.

It should be noted that, a region in which the top opening 110*b* is substantially located is shown by using a dashed line in FIG. 7.

In this way, compared with the bottom surface 110*a*, the top opening 110*b* with a larger size is conducive to causing the tunneling dielectric layer to fill up the groove 110 uniformly, so that formation of a gap between the groove 110 and the tunneling dielectric layer 101 is avoided, and formation of a gap between the tunneling dielectric layer 101 and the doped conductive layer 102 can be further avoided. This further facilitates improving the film layer uniformity of the tunneling dielectric layer 101 and the doped conductive layer 102 formed over the rear surface b and reducing a quantity of recombination sites on the rear surface b, thereby improving a passivation effect of the tunneling dielectric layer and the doped conductive layer on the N-type silicon substrate 100. On the other hand, the structure with a wide top and a narrow bottom of the groove 110 helps further improve a specific surface area of the N-type silicon substrate 100, to further improve specific surface areas of the tunneling dielectric layer 101 and the doped conductive layer 102, thereby improving contact areas between an electrode and the doped conductive layer 102 as well as the tunneling dielectric layer 101, reducing contact resistance between the electrode and the doped conductive layer 102 as well as the tunneling dielectric layer 101, and improving the collection efficiency of the electrode for carriers.

In some embodiments, a ratio of the area of the orthographic projection of the bottom surface 110*a* on the N-type silicon substrate 100 to the area of the orthographic projection of the top opening 110*b* on the N-type silicon substrate 100 ranges from 0.5 to 0.99. For example, the ratio of the area of the orthographic projection of the bottom surface 110*a* on the N-type silicon substrate 100 to the area of the orthographic projection of the top opening 110*b* on the N-type silicon substrate 100 is 0.55, 0.6, 0.65, 0.7, 0.75, 0.8, 0.85, 0.9, or the like.

In some embodiments, a shape of an orthographic projection of the groove 110 on the N-type silicon substrate 100 is a polygon with M sides, and M is greater than or equal to 3.

In some embodiments, referring to FIG. 2 to FIG. 5, the shape of the orthographic projection of the groove 110 on the N-type silicon substrate 100 is mostly a quadrilateral. During actual application, the shape of the orthographic projection of the groove 110 on the N-type silicon substrate 100 may alternatively be a polygon other than the quadrilateral. In some embodiments, the quadrilateral includes a rectangle, a diamond, a square, and a trapezoid, and may also include an irregular quadrilateral.

Figure 8:
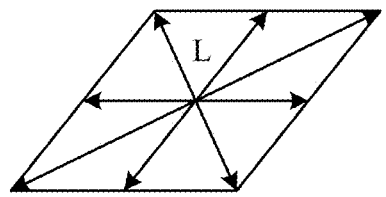
FIG. 8 is a schematic diagram illustrating a top view of a top opening in a single groove according to an embodiment of the present disclosure.

In some embodiments, referring to FIG. 7 and FIG. 8, FIG. 8 is a schematic diagram illustrating a top view of a top opening 110*b* in a single groove 110 according to an embodiment of the present disclosure. In the direction Y away from the rear surface b, the groove 110 includes the top opening 110*b*, and a one-dimensional size L of the top opening 110*b* ranges from 1 μm to 20 μm. For example, the one-dimensional size L is 3 μm, 5 μm, 7 μm, 10 μm, 13 μm, 16 μm, 19 μm, or the like. As shown in FIG. 7, the groove 110 further includes the bottom surface 110*a* opposite to the top opening 110*b* and the side wall 110*c* located between the bottom surface 110*a* and the top opening 110*b*.

It should be noted that, referring to FIG. 8, the one-dimensional size L of the top opening 110*b* includes any one of a length of the top opening 110*b*, a width of the top opening 110*b*, or a diagonal length of the top opening 110*b*. In addition, in FIG. 8, an example in which a shape of the orthographic projection of the top opening 110*b* on the N-type silicon substrate 100 is a regular quadrilateral is used. In this case, the one-dimensional size L of the top opening 110*b* is any one of a length, a width, or a diagonal length of the regular quadrilateral.

Figure 9:
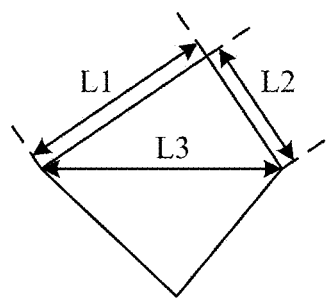
FIG. 9 is another schematic diagram illustrating a top view of a top opening in a single groove according to an embodiment of the present disclosure.

During actual application, the shape of the orthographic projection of the top opening 110*b* on the N-type silicon substrate 100 may alternatively be an irregular polygon. In this case, the length of the top opening 110*b*, the width of the top opening 110*b*, or the diagonal length of the top opening 110*b* is not absolute, and is self-defined to represent the one-dimensional size of the top opening 110*b*. For example, referring to FIG. 9, FIG. 9 is another schematic diagram illustrating a top view of a top opening 110*b* in a single groove 110 according to an embodiment of the present disclosure, and the shape of the orthographic projection of the top opening 110*b* on the N-type silicon substrate 100 is an irregular quadrilateral. In this case, a length L1 of the top opening 110*b* may be defined as a side length of a longest side of the irregular quadrilateral, a width L2 of the top opening 110*b* may be defined as a side length of a shortest side of the irregular quadrilateral, and a diagonal length L3 of the top opening 110*b* may be defined as a side length of a longest diagonal of the irregular quadrilateral. It should be understood that, the foregoing is merely an example for description, and during actual application, the length, the width, and the diagonal length may be flexibly defined according to an actual requirement.

In addition, in addition to an irregular polygon, the shape of the orthographic projection of the top opening 110*b* on the N-type silicon substrate 100 may alternatively be a circle or an irregular shape similar to a circle. In this case, the one-dimensional size L of the top opening 110*b* is obtained by selecting a plurality of regions with different specific areas in the top opening 110*b*, where the region with a specific area may be flexibly defined according to an actual requirement, and calculating an average value of lengths, widths, diagonals, or diameters of the plurality of regions with different specific areas.

In some embodiments, a distribution density of the grooves 110 on the rear surface b ranges from $100/mm^2$ to $200000/mm^2$. In some examples, the distribution density of the grooves 110 on the rear surface b ranges from $1000/mm^2$ to $50000/mm^2$. For example, the distribution density of the grooves 110 is $1850/mm^2$, $3550/mm^2$, $6500/mm^2$, $25000/mm^2$, $34000/mm^2$, $45000/mm^2$, $49000/mm^2$, or the like.

In some embodiments, in the direction away from the rear surface b, a maximum value of a depth of the groove 110 ranges from 50 nm to 2000 nm. For example, the depth of the groove 110 is 65 nm, 87 nm, 500 nm, 650 nm, 1200 nm, 1400 nm, 1700 nm, or the like.

In some cases, for the entire rear surface b, a layout area occupied by a single groove 110 is quite small. Therefore, compared with the pyramid structure with a sharp top, influence of the grooves 110 on the rear surface b on the flatness of the rear surface b is quite small, so that high flatness of the rear surface b is ensured while the specific surface area of the N-type silicon substrate 100 is improved by using the grooves 110. Therefore, specific surface areas of the tunneling dielectric layer 101 and the doped conductive layer 102 are improved, and the film layer uniformity of the tunneling dielectric layer 101 and the doped conductive layer 102 is improved while contact areas between an electrode and the doped conductive layer 102 as well as the tunneling dielectric layer 101 are improved, so that a passivation effect of the tunneling dielectric layer 101 and the doped conductive layer 102 on the N-type silicon substrate 100 is improved.

The following describes the morphology of the rear surface b in detail by using four embodiments.

In some embodiments, referring to FIG. 2, the one-dimensional size of a single groove 110 ranges from 2 μm to 8 μm, the distribution density of the grooves 110 ranges from $5000/mm^2$ to $200000/mm^2$, and in the direction away from the rear surface b, the maximum value of the depth of the groove 110 ranges from 200 nm to 2000 nm.

In some other embodiments, referring to FIG. 3, the one-dimensional size of a single groove 110 ranges from 5 μm to 13 μm, the distribution density of the grooves 110 ranges from $100/mm^2$ to $50000/mm^2$, and in the direction away from the rear surface b, the maximum value of the depth of the groove 110 ranges from 50 nm to 1200 nm.

In still some other embodiments, referring to FIG. 4, the one-dimensional size of a single groove 110 ranges from 3 μm to 15 μm, the distribution density of the grooves 110 ranges from $100/mm^2$ to $100000/mm^2$, and in the direction away from the rear surface b, the maximum value of the depth of the groove 110 ranges from 100 nm to 2000 nm.

In yet some other embodiments, referring to FIG. 5, the one-dimensional size of a single groove 110 ranges from 7 μm to 20 μm, the distribution density of the grooves 110 ranges from $100/mm^2$ to $20000/mm^2$, and in the direction away from the rear surface b, the maximum value of the depth of the groove 110 ranges from 50 nm to 1000 nm.

Figure 10:
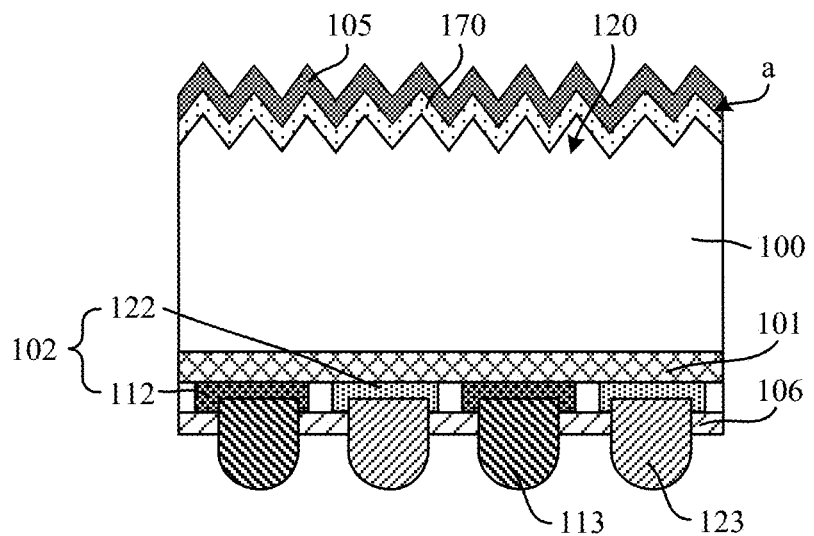
FIG. 10 is another schematic diagram illustrating a cross-sectional view of a partial structure of a solar cell according to an embodiment of the present disclosure.
Figure 11:
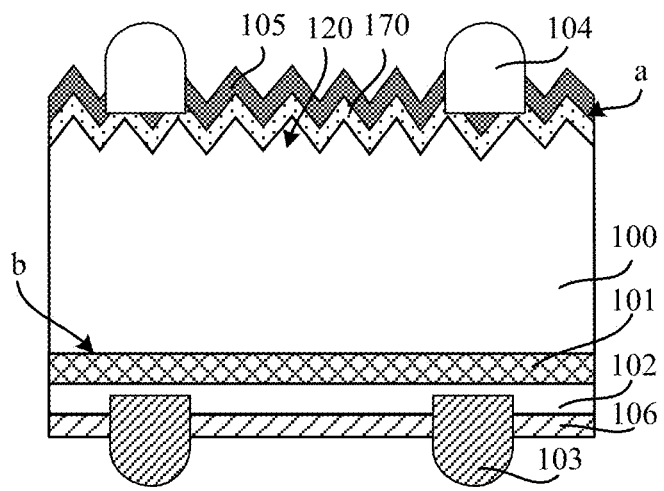
FIG. 11 is still another schematic diagram illustrating a cross-sectional view of a partial structure of a solar cell according to an embodiment of the present disclosure.

In some embodiments, referring to FIG. 1, FIG. 10, or FIG. 11, the passivation layer 105 formed over the front surface a may be regarded as a positive passivation layer or a front passivation layer. The passivation layer 105 may be a single-layer or layered structure, and materials of layers in the layered structure may be different from each other, or materials of some layers may be different and materials of some other layers may be the same. A material of the passivation layer 105 may be at least one material of silicon oxide, silicon nitride, silicon oxynitride, silicon oxycarbonitride, titanium oxide, hafnium oxide, aluminum oxide, or the like.

In some embodiments, referring to FIG. 10 or FIG. 11, the solar cell further includes a back passivation layer 106 formed over the rear surface b, and the back passivation layer 106 may also be regarded as a rear passivation layer. The following describes the back passivation layer 106 in FIG. 10 and FIG. 11 in detail.

In some embodiments, the back passivation layer 106 may include a single-layer structure or a layered structure, and a material of the back passivation layer 106 may include at least one material of silicon oxide, silicon nitride, silicon oxynitride, silicon oxycarbonitride, titanium oxide, hafnium oxide, aluminum oxide, or the like.

In some embodiments, referring to FIG. 10 or FIG. 11, the solar cell further includes a P-type emitter 170 which may be regarded as a portion with certain thickness in the N-type silicon substrate 100, and at least some of the front surface a serves as a top surface of the P-type emitter 170. In some examples, referring to FIG. 10 or FIG. 11, the entire front surface a serves as the top surface of the P-type emitter 170, and in some other examples, a part of the front surface a serves as the top surface of the P-type emitter 170, to form a selective emitter.

A type of doping elements of the P-type emitter 170 is different from a type of doping elements of the N-type silicon substrate 100, so that a PN junction is formed between the P-type emitter 170 and the N-type silicon substrate 100.

In some embodiments, still referring to FIG. 10 or FIG. 11, the passivation layer 105 is formed over a surface of the P-type emitted 170 away from the N-type silicon substrate 100 and provides a good passivation effect on the front surface a of the N-type silicon substrate 100, so that a defect density of the front surface a of the N-type silicon substrate 100 is reduced, and carrier recombination on the front surface a of the N-type silicon substrate 100 is well suppressed. The passivation layer 105 can further provide a good anti-reflection effect, so that reflection of incident light by the front surface a of the N-type silicon substrate 100 is reduced, and the utilization of the incident light by the N-type silicon substrate 100 is improved. In some cases, the solar cell provided in the embodiment of the present disclosure may be a TOPCON cell or an IBC cell.

In some embodiments, referring to FIG. 1, the solar cell may be a tunnel oxide passivated contact (TOPCON) cell, the doped conductive layer 102 includes N-type doping elements, and covers a surface of the tunneling dielectric layer 101 away from the N-type silicon substrate 100. In other words, the doped conductive layer 102 and the N-type silicon substrate 100 include doping elements of a same conductive type, and a doping concentration of the N-type doping elements in the doped conductive layer 102 is higher than a doping concentration of the N-type doping elements in the N-type silicon substrate 100, to form a front-junction TOPCON cell.

In some other embodiments, still referring to FIG. 1, the solar cell may be a TOPCON cell, the doped conductive layer 102 includes P-type doping elements, and the doped conductive layer 102 covers a surface of the tunneling dielectric layer 101 away from the N-type silicon substrate 100. In other words, the doped conductive layer 102 and the N-type silicon substrate 100 include doping elements of different conductive types, to form a back-junction TOPCON cell.

In the foregoing two embodiments, referring to FIG. 11, FIG. 11 is still another schematic diagram illustrating a cross-sectional view of a partial structure of a solar cell according to an embodiment of the present disclosure. The solar cell further includes an electrode 103, forming an ohmic contact with the doped conductive layer 102, and the doped conductive layer 102 and the tunneling dielectric layer 101 form a passivation contact structure. It should be noted that, an example in which the electrode 103 is embedded in the doped conductive layer 102 is shown in FIG. 11. During actual application, the electrode 103 may pass through the doped conductive layer 102 and be contact with and electrically connected to the tunneling dielectric layer 101. In some embodiments, still referring to FIG. 11, the solar cell further includes a first electrode 104, where the first electrode 104 forms an ohmic contact with the front surface a. It should be noted that, the electrode 103 located on the rear surface b may be regarded as a second electrode.

In some embodiments, the electrode 103 and the first electrode 104 may be formed by sintering a metal conductive paste. In some embodiments, materials of the electrode 103 and the first electrode 104 include at least one of metal materials such as silver, aluminum, copper, and nickel.

In the foregoing two embodiments, referring to FIG. 11, the back passivation layer 106 is formed over a surface of the doped conductive layer 102 away from the rear surface b, and the electrode 103 further passes through the back passivation layer 106.

In still some other embodiments, referring to FIG. 10, FIG. 10 is another schematic diagram illustrating a cross-sectional view of a partial view of a solar cell according to an embodiment of the present disclosure. The solar cell may be an interdigitated back contact (IBC) cell, the doped conductive layer 102 includes a first part 112 and a second part 122 that are spaced apart, one of the first part 112 and the second part 122 includes doping elements of a conductive type the same as that of the N-type silicon substrate 100, and the other includes doping elements of a conductive type different from that of the N-type silicon substrate 100. In other words, one of the first part 112 and the second part 122 is an N-type doped conductive layer, and the other is a P-type doped conductive layer. In this case, a tunneling dielectric layer 101 in contact with and electrically connected to the N-type doped conductive layer also includes N-type doping elements, and a tunneling dielectric layer 101 in contact with and electrically connected to the P-type doped conductive layer also includes P-type doping elements.

In some embodiments, still referring to FIG. 10, spacing (i.e. a gap) or an isolation structure (not marked in the figure) exists between the first part 112 and the second part 122, to implement automatic isolation between regions of different conductive types, so that influence of electric leakage, caused by a tunnel junction formed between heavily doped P-type doped regions and N-type doped regions on a back surface of the IBC cell, on the cell efficiency can be eliminated.

In some embodiments, still referring to FIG. 10, the back passivation layer 106 is formed over surfaces of the first part 112 and the second part 122 away from the rear surface b.

In some embodiments, the solar cell includes: a first sub-electrode 113, passing through the back passivation layer 106 to be electrically connected to the first part 112, and a second sub-electrode 123, passing through the back passivation layer 106 to be electrically connected to the second part 122. It should be noted that, an example in which the first sub-electrode 113 is embedded in the first part 112 and the second sub-electrode 123 is embedded in the second part 122 is shown in FIG. 10. During actual application, the first sub-electrode 113 may pass through the first part 112 to be in contact with and electrically connected to the tunneling dielectric layer 101, and the second sub-electrode 123 may pass through the second part 122 to be in contact with and electrically connected to the tunneling dielectric layer 101. In some embodiments, the first sub-electrode 113 and the second sub-electrode 123 may be formed by sintering a metal conductive paste. In some embodiments, materials of the first sub-electrode 113 and the second sub-electrode 123 include at least one of metal materials such as silver, aluminum, copper, and nickel.

Based on the above, on one hand, compared with the pyramid structure with a sharp top, the rear surface b including a plurality of grooves 110 is flatter, which facilitates improving the film layer uniformity of the tunneling dielectric layer 101 and the doped conductive layer 102 formed over the rear surface b, thereby improving a passivation effect of the tunneling dielectric layer and the doped conductive layer on the N-type silicon substrate 100. On the other hand, the rear surface b including the plurality of grooves 110 also facilitates improving a specific surface area of the N-type silicon substrate 100, to improve specific surface areas of the tunneling dielectric layer 101 and the doped conductive layer 102, thereby improving contact areas between the electrode and the doped conductive layer 102 as well as the tunneling dielectric layer 101, reducing contact resistance between the electrode and the doped conductive layer 102 as well as the tunneling dielectric layer 101, and improving the collection efficiency of the electrode for carriers. Therefore, combining the two aspects helps improve a short-circuit voltage and the photoelectric conversion efficiency of the solar cell.

Figure 12:
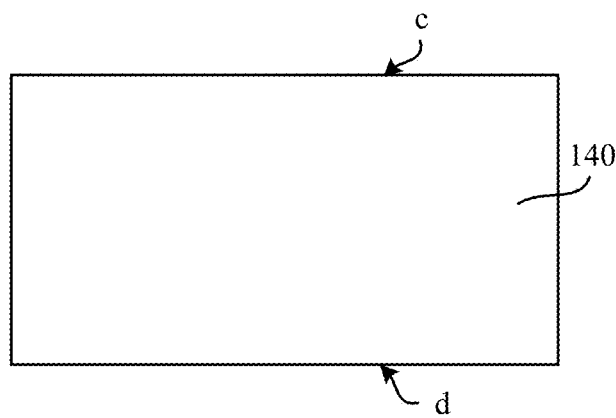
FIG. 12 is a schematic diagram illustrating a cross-sectional view of a partial structure of an initial N-type silicon substrate according to another embodiment of the present disclosure.
Figure 13:
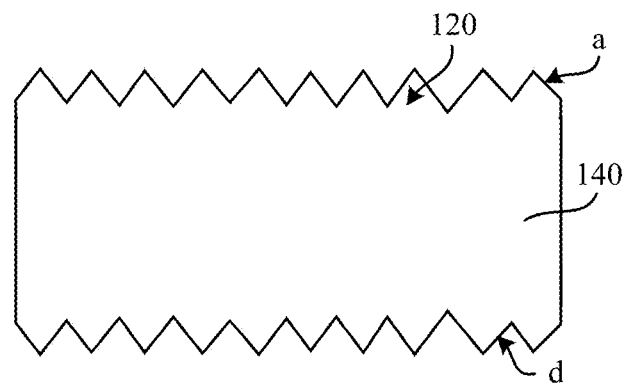
FIG. 13 is a schematic diagram illustrating a cross-sectional view of a partial structure of an initial N-type silicon substrate on which texturing processing is performed according to another embodiment of the present disclosure.
Figure 14:
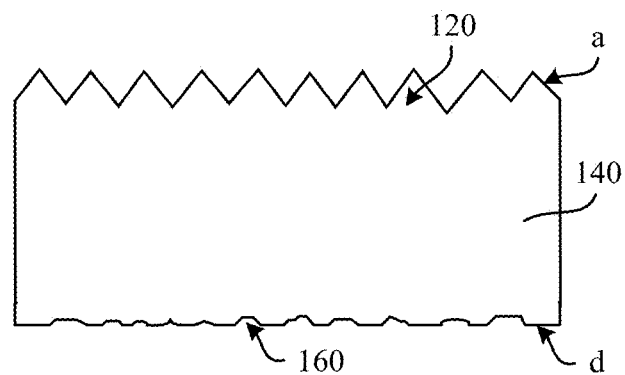
FIG. 14 is a schematic diagram illustrating a cross-sectional view of a partial structure of an initial N-type silicon substrate with a second surface etched by using a first etching process according to another embodiment of the present disclosure.

Another embodiment of the present disclosure further provides a method for preparing a solar cell, configured to form the solar cell provided in the foregoing embodiments. The following describes the method for preparing a solar cell according to the another embodiment of the present disclosure in detail with reference to the accompanying drawings. FIG. 12 to FIG. 14 are schematic diagrams illustrating cross-sectional views of structures corresponding to operations of a method for preparing a solar cell according to another embodiment of the present disclosure.

FIG. 12 is a schematic diagram illustrating a cross-sectional view of a structure of an initial N-type silicon substrate according to another embodiment of the present disclosure, FIG. 13 is a schematic diagram illustrating a cross-sectional view of a structure of an initial N-type silicon substrate on which texturing processing is performed according to another embodiment of the present disclosure, and FIG. 14 is a schematic diagram illustrating a cross-sectional view of a structure of an initial N-type silicon substrate with a second surface etched by using a first etching process according to another embodiment of the present disclosure. It should be noted that, for parts the same as or corresponding to the foregoing embodiments, reference may be made to the corresponding description of the foregoing embodiments, and details are not described herein again.

Referring to FIG. 1 to FIG. 14, the method for preparing the solar cell includes the following operations:

In S101, referring to FIG. 12, an initial N-type silicon substrate 140 is provided. The initial N-type silicon substrate 140 includes a first surface c and a second surface d that are opposite to each other. In some embodiments, the initial N-type silicon substrate 140 is formed by performing slicing processing on a silicon wafer.

In S102, referring to FIG. 13, performing texturing processing on the initial N-type silicon substrate 140, to form pyramid structures 120 on both the first surface c and the second surface d. In this way, the first surface c on which the pyramid structures 120 are formed may serve as a front surface a of an N-type silicon substrate 100.

In S103, referring to FIG. 13 and FIG. 14, the second surface d is subjected to a first etching process, to form initial grooves 160. It should be noted that, in another embodiment of the present disclosure, a cross-sectional shape of the initial groove 160 is not limited, and FIG. 14 shows merely an example of the initial groove 160.

In S104, referring to any one of FIG. 14 and FIG. 2 to FIG. 5, the second surface d is subjected to a second etching process, to increase sizes of the initial grooves 160 to form an N-type silicon substrate 100 including grooves 110, where some grooves 110 are arranged sequentially along one arrangement direction. An etching rate of the first etching process on the second surface d is less than an etching rate of the second etching process on the second surface d, the first surface c on which the pyramid structures 120 are formed serves as the front surface a of the N-type silicon substrate 100, and the second surface d processed by using the first etching process and the second etching process serves as the rear surface b of the N-type silicon substrate 100.

In S105, referring to FIG. 1, a tunneling dielectric layer 101 is formed over the rear surface b and a doped conductive layer 102 is formed over the tunneling dielectric layer 101.

In some cases, compared with the front surface a including the pyramid structures 120 with a sharp top, the rear surface b including a plurality of grooves 110 is flatter, which helps improve the film layer uniformity of the tunneling dielectric layer 101 and the doped conductive layer 102 formed on the rear surface b, thereby improving a passivation effect of the tunneling dielectric layer and the doped conductive layer on the N-type silicon substrate 100. On the other hand, the rear surface b including the plurality of grooves 110 also helps improve a specific surface area of the N-type silicon substrate 100, to improve specific surface areas of the tunneling dielectric layer 101 and the doped conductive layer 102, thereby improving contact areas between an electrode and the doped conductive layer 102 as well as the tunneling dielectric layer 101, reducing contact resistance between the electrode and the doped conductive layer 102 as well as the tunneling dielectric layer 101, and improving the collection efficiency of the electrode for carriers. Therefore, combining the two aspects helps improve a short-circuit voltage the photoelectric conversion efficiency of the solar cell.

The following describes operations S101 to S105 in detail.

In some embodiments, referring to FIG. 12, a material of the initial N-type silicon substrate 140 provided in operation S101 may include at least one of monocrystalline silicon, polycrystalline silicon, amorphous silicon, or microcrystalline silicon.

In some embodiments, referring to FIG. 13, in S102, performing texturing processing on the initial N-type silicon substrate 140 includes performing double-sided texturing on the initial N-type silicon substrate 140. For example, the pyramid structure 120 is prepared in a wet chemical corrosion manner, and the pyramid structure 120 may reduce reflection on a surface of the initial N-type silicon substrate 140 for light, thereby increasing the absorption utilization of the initial N-type silicon substrate 140 for light and improving the conversion efficiency of the solar cell. It should be noted that, specific operation manners of texturing are not limited in the another embodiment of the present disclosure. For example, texturing may be performed by using, but not limited to, a wet texturing process. For example, texturing may be performed by using an alkali solution such as a sodium hydroxide solution, and due to the anisotropic property of the corrosion of the sodium hydroxide solution, it is favorable to obtain pyramid-shaped microstructures. The pyramid-shaped microstructure may be a tetrahedron, a structure similar to a tetrahedron, a pentahedron, or a structure similar to a pentahedron. In addition, the texturing process may alternatively be chemical etching, laser etching, a mechanical method, or plasma etching.

In some cases, due to the pyramid structure 120, when the first electrode 104 (referring to FIG. 11) is formed by screen printing from a metal paste, the first electrode may be better filled in the pyramid structure 120 to obtain more excellent electrode contact, so that series resistance of the solar cell can be effectively reduced, and filling factors can be improved.

In some embodiments, after operation S102 is performed and before operation S103 is performed, the method for preparing the solar cell may further include: performing doping processing of P-type doping ions on the first surface c, for example, boron diffusion processing, to form a P-type emitter 170 on the first surface c (referring to FIG. 10). The P-type emitter 170 occupies a part of surface space of the initial N-type silicon substrate 140 that receives light.

In some cases, the P-type emitter 170 may be a P-type doped layer formed by using a boron source to diffuse boron atoms to a specific depth of the first surface c by using a diffusion process. For example, the boron source may be liquid boron tribromide. A microcrystalline silicon phase of a substrate subjected to boron diffusion processing is converted into a polycrystalline silicon phase. A surface of a semiconductor substrate includes high-concentration boron, so that a borosilicate glass (BSG) layer is generally formed on the first surface c and the second surface d.

In some embodiments, after the P-type emitter 170 is formed and before operation S103 is performed, the method for preparing the solar cell may further include: removing the borosilicate glass layer formed over the second surface d by using mixed acid, and performing water washing and drying processing on the second surface d on which acid washing is performed. Here, the mixed acid may be a hydrofluoric acid solution with mass fraction ranging from 0.1% to 10%, a sulfuric acid solution with mass fraction ranging from 10% to 20%, and a nitric acid solution with mass fraction ranging from 25% to 50%.

In some cases, during boron diffusion processing, some borosilicate glass may be formed on the second surface d of the initial N-type silicon substrate 140 due to winding plating, and the borosilicate glass needs to be removed by using the mixed acid.

In some embodiments, a time length consumed for removing the borosilicate glass layer formed on the second surface d by using the mixed acid ranges from 10 s to 180*s*, and a reaction temperature is controlled to range from 7° C. to 20° C. That is, acid washing removing is performed on the borosilicate glass layer on the second surface d in a normal temperature state.

Figure 15:
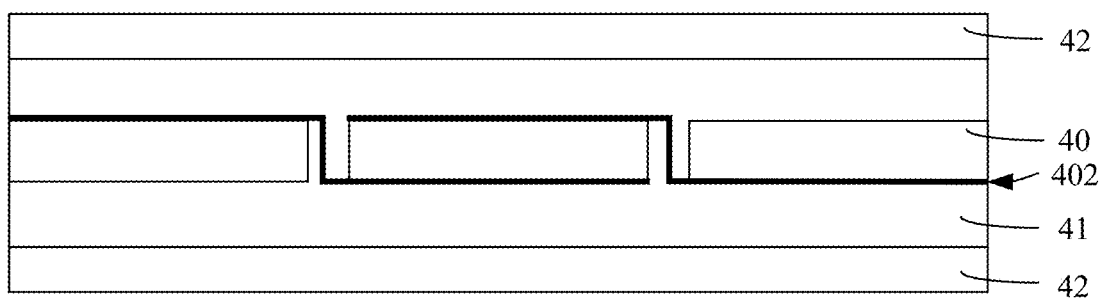
FIG. 15 is a schematic diagram illustrating a photovoltaic module according to another embodiment of the present disclosure.

In some embodiments, referring to FIG. 13 and FIG. 14, in operation S103, the operation of subjecting the second surface d to a first etching process may include: immersing the initial N-type silicon substrate 140 in a first etching solution. Referring to FIG. 14 and FIG. 15, in operation S104, the operation of subjecting the second surface d to a second etching process may include: immersing the initial N-type silicon substrate 140 in a second etching solution. A mass fraction of sodium hydroxide in the first etching solution is less than or equal to a mass fraction of sodium hydroxide in the second etching solution.

In some cases, subjecting the second surface d to the first etching processing is mainly to reduce some pyramid structures 120 on the second surface d in size and even remove at least some pyramid structures 120, to form the initial grooves 160. It should be noted that, when the initial N-type silicon substrate 140 is subjected to double-sided texturing processing to form the pyramid structures 120, adjacent pyramid structures 120 may be connected or spaced apart. when the first etching processing is used to reduce the sizes of pyramid structures 120 on the second surface d, adjacent pyramid structures 120 space apart with an interval, and the interval gradually increases and finally evolves into the initial groove 160, thereby improving a morphology of the second surface d.

In addition, subjecting the second surface d to the second etching processing is mainly to enlarge the sizes of initial grooves 160 to form the N-type silicon substrate 100 including grooves 110, where some grooves 110 are arranged sequentially along one arrangement direction. In other words, by subjecting the second surface d to the second etching processing, the sizes of pyramid structures 120 on the second surface d is further reduced and at least some pyramid structures 120 are even removed to form more grooves 110. In addition, this operation helps further increase the interval between adjacent pyramid structures 120, and increase a depth of the initial groove 160, so as to form a groove 110 with a larger size.

In some cases, a partial region located on the outside of the groove 110 is not obtained from the interval between adjacent pyramid structures 120 through processing but is obtained by further etching on a region in which a removed pyramid structure 120 is located. Therefore, a time length that a center region of the groove 110 exposed in an etching environment becomes longer, that is, an etched degree of a region corresponding to the interval between adjacent pyramid structures 120 is greater; and a time length that the partial region located on the outside of the groove 110 exposed in the etching environment becomes shorter, that is, an etched degree of a region corresponding to the removed pyramid structure 120 is smaller, thereby helping forming the groove 110 whose cross-sectional shape is an inverted trapezoid shown in FIG. 7.

In addition, the mass fraction of the sodium hydroxide in the first etching solution is less than or equal to the mass fraction of the sodium hydroxide in the second etching solution, that is, alkalinity of the first etching solution is lower than alkalinity of the second etching solution, so that an etching rate of the first etching processing on the second surface d is less than an etching rate of the second etching processing on the second surface d. It should be noted that, methods for causing the etching rate of the first etching processing on the second surface d to be less than the etching rate of the second etching processing on the second surface d include, but not limited to, controlling the alkalinity of the first etching solution to be lower than the alkalinity of the second etching solution.

In some embodiments, the mass fraction of the sodium hydroxide in the first etching solution may range from 0.5% to 2%, and the mass fraction of the sodium hydroxide in the second etching solution may range from 2% to 4%.

In some embodiments, both the first etching solution and the second etching solution include a protective agent, and a mass fraction of the protective agent in the first etching solution is less than a mass fraction of the protective agent in the second etching solution. In some cases, the borosilicate glass layer formed on the first surface c during boron diffusion processing is not processed, and the protective agent may cooperate with the borosilicate glass layer, to prevent the first etching solution and the second etching solution from etching the pyramid structures 120 formed on the first surface. In addition, since the mass fraction of the sodium hydroxide in the second etching solution is greater than or equal to the mass fraction of the sodium hydroxide in the first etching solution, that is, the alkalinity of the second etching solution is stronger, on this basis, causing the mass fraction of the protective agent in the first etching solution to be less than the mass fraction of the protective agent in the second etching solution, that is, improving the mass fraction of the protective agent in the second etching solution, helps further prevent the second etching solution from etching the pyramid structures 120 formed on the first surface.

In some embodiments, the protective agent is an oxide layer protective agent.

In some embodiments, the mass fraction of the protective agent in the first etching solution ranges from 0.5% to 0.8%, and the mass fraction of the protective agent in the second etching solution ranges from 1% to 1.5%.

In some embodiments, the second surface d is subjected to the first etching processing at a first temperature Temp1, the second surface d is subjected to the second etching processing at a second temperature Temp2, and the first temperature Temp1 is lower than the second temperature Temp2. In some cases, a higher ambient temperature during subjecting the second surface d to etching processing indicates a higher etching rate of an etching processing on the second surface d. Therefore, the first temperature Temp1 being lower than the second temperature Temp2 also helps cause the etching rate of the first etching processing on the second surface d to be less than the etching rate of the second etching processing on the second surface d.

In some embodiments, the first temperature Temp1 may range from 30° C. to 45° C., and the second temperature Temp2 may range from 70° C. to 85° C.

It should be noted that, the etching rate of the first etching processing on the second surface d may be set to be less than the etching rate of the second etching processing on the second surface d by adjusting the alkalinity of the first etching solution and the alkalinity of the second etching solution or by adjusting the ambient temperature during the first etching processing and the ambient temperature during the second etching processing. In the another embodiment of the present disclosure, the method for adjusting the etching rate of the first etching processing and the etching rate of the second etching processing includes, but not limited to, the foregoing two solutions.

In some embodiments, duration of subjecting the second surface d to the first etching processing is a first time length Time1, duration of subjecting the second surface d to the second etching processing is a second time length Time2, and the first time length Time1 is greater than or equal to the second time length Time2. In some cases, the time length of subjecting the second surface d to the first etching processing is longer, which is mainly used for performing low-speed alkali polishing on the second surface to remove most pyramid structures 120 on the second surface d, to prepare for formation of the grooves 110; and the time length of subjecting the second surface d to the second etching processing is shorter, which is mainly configured to increase the depth of the initial groove 160.

In some embodiments, the first time length Time1 may range from 300 s to 600 s, and the second time length Time2 may range from 50 s to 300 s.

The following describes manufacturing of the morphology of the rear surface b in detail by using four embodiments.

In some embodiments, to form the rear surface b shown in FIG. 2, the mass fraction of the sodium hydroxide in the first etching solution ranges from 0.5% to 2%, and the mass fraction of the sodium hydroxide in the second etching solution ranges from 2% to 5%; the mass fraction of the protective agent in the first etching solution ranges from 0.5% to 0.8%, and the mass fraction of the protective agent in the second etching solution ranges from 1% to 1.5%; the first temperature ranges from 30° C. to 45° C., and the second temperature ranges from 70° C. to 85° C.; and the first time length ranges from 300 s to 400 s, and the second time length ranges from 150 s to 300 s.

In some other embodiments, to form the rear surface b shown in FIG. 3, the mass fraction of the sodium hydroxide in the first etching solution ranges from 0.5% to 2%, and the mass fraction of the sodium hydroxide in the second etching solution ranges from 2% to 5%; the mass fraction of the protective agent in the first etching solution ranges from 0.5% to 0.8%, and the mass fraction of the protective agent in the second etching solution ranges from 1% to 1.5%; the first temperature ranges from 30° C. to 45° C., and the second temperature ranges from 70° C. to 85° C.; and the first time length ranges from 400 s to 550 s, and the second time length ranges from 50 s to 200 s.

In still some other embodiments, to form the rear surface b shown in FIG. 4, the mass fraction of the sodium hydroxide in the first etching solution ranges from 0.5% to 2%, and the mass fraction of the sodium hydroxide in the second etching solution ranges from 2% to 5%; the mass fraction of the protective agent in the first etching solution ranges from 0.5% to 0.8%, and the mass fraction of the protective agent in the second etching solution ranges from 1% to 1.5%; the first temperature ranges from 30° C. to 45° C., and the second temperature ranges from 70° C. to 85° C.; and the first time length ranges from 400 s to 550 s, and the second time length ranges from 100 s to 300 s.

In yet some other embodiments, to form the rear surface b shown in FIG. 5, the mass fraction of the sodium hydroxide in the first etching solution ranges from 0.5% to 2%, and the mass fraction of the sodium hydroxide in the second etching solution ranges from 2% to 5%; the mass fraction of the protective agent in the first etching solution ranges from 0.5% to 0.8%, and the mass fraction of the protective agent in the second etching solution ranges from 1% to 1.5%; the first temperature ranges from 30° C. to 45° C., and the second temperature ranges from 70° C. to 85° C.; and the first time length ranges from 450 s to 600 s, and the second time length ranges from 50 s to 200 s.

It should be noted that, in the foregoing four examples of formation of the rear surface b with four morphologies shown in FIG. 2 to FIG. 5, the mass fraction of the sodium hydroxide in the first etching solution, the mass fraction of the sodium hydroxide in the second etching solution, the mass fraction of the protective agent in the first etching solution, the mass fraction of the protective agent in the second etching solution, the first temperature, and the second temperature may all be specified according to an agreed standard. That is, in the foregoing four examples, values of the foregoing parameters may be the same or taken from a same value range, and only etching time lengths of the four examples are different. In other words, only the first time length and the second time length in the four examples have different value ranges and different values. During actual application, to form the rear surface b with the four different morphologies shown in FIG. 2 to FIG. 5, values and value ranges of the mass fraction of the sodium hydroxide in the first etching solution, the mass fraction of the sodium hydroxide in the second etching solution, the mass fraction of the protective agent in the first etching solution, the mass fraction of the protective agent in the second etching solution, the first temperature, the second temperature, the first time length, and the second time length may be flexibly adjusted according to an actual requirement.

In some embodiments, in S105, referring to FIG. 1, forming a tunneling dielectric layer 101 and a doped conductive layer 102 may include the following operations:

In some embodiments, the tunneling dielectric layer 101 is formed by using a deposition process. To be specific, a material of the tunneling dielectric layer 101 includes silicon oxide, and the deposition process includes a chemical vapor deposition process. In other embodiments, the tunneling dielectric layer may alternatively be formed by using an in-situ formation process. To be specific, based on the N-type silicon substrate 100, processes such as a thermal oxidation process and nitric acid oxidation may be used to form the tunneling dielectric layer 101 in-situ.

In some embodiments, after the tunneling dielectric layer 101 is formed, intrinsic polysilicon is deposited to form a polysilicon layer, and phosphorus ions are doped in an ion injection and heat source diffusion manner to form an N-type doped polysilicon layer, where the doped polysilicon layer serves as the doped conductive layer 102; and in a direction X, a thickness of the doped conductive layer 102 may be set to range from 50 nm to 200 nm, for example, 100 nm, 120 nm, or 140 nm.

It should be noted that, a preparation process for forming the tunneling dielectric layer 101 and the doped conductive layer 102 in a front-junction TOPCON cell is described above by using examples. During actual application, a back-junction TOPCON cell or an IBC cell may alternatively be formed, and a preparation process for forming a tunneling dielectric layer 101 and a doped conductive layer 102 in a back-junction TOPCON cell or an IBC cell is not limited in the another embodiment of the present disclosure.

In some embodiments, referring to FIG. 10, the method for preparing the solar cell may further include: forming a first sub-electrode 113 that forms an ohmic contact with the first part 112, and forming a second sub-electrode 123 that forms an ohmic contact with the second part 122. A preparation process for forming the first sub-electrode 113 and the second sub-electrode 123 is also not limited in the another embodiment of the present disclosure. In some other embodiments, referring to FIG. 11, the method for preparing the solar cell may further include: forming an electrode 103 that forms an ohmic contact with the doped conductive layer 102, and forming a first electrode 104 that forms an ohmic contact with the front surface a. A preparation process for forming the electrode 103 and the first electrode 104 is also not limited in the another embodiment of the present disclosure.

In some embodiments, referring to FIG. 10 or FIG. 11, the method for preparing the solar cell may further include: forming a passivation layer 105 over the front surface a; and forming a back passivation layer 106 over a surface of the doped conductive layer 102 away from the rear surface b. A preparation process for forming the passivation layer 105 and the back passivation layer 106 is also not limited in the another embodiment of the present disclosure.

Based on the above, the first etching processing and the second etching processing are sequentially performed on the second surface d of the initial N-type silicon substrate 140, and the etching rate of the first etching processing on the second surface d is less than the etching rate of the second etching processing on the second surface d. This helps form the rear surface b including a plurality of grooves 110. In addition, compared with the pyramid structure 120 with a sharp top, the rear surface b including the plurality of grooves 110 is flatter, so as to facilitate improving the film layer uniformity of the tunneling dielectric layer 101 and the doped conductive layer 102 formed on the rear surface b, thereby improving a passivation effect of the tunneling dielectric layer and the doped conductive layer on the N-type silicon substrate 100. In addition, the rear surface b including the plurality of grooves 110 also helps improve a specific surface area of the N-type silicon substrate 100, to improve specific surface areas of the tunneling dielectric layer 101 and the doped conductive layer 102, thereby improving contact areas between the electrode 103 and the doped conductive layer 102 as well as the tunneling dielectric layer 101, reducing contact resistance between the electrode and the doped conductive layer 102 as well as the tunneling dielectric layer 101, and improving the collection efficiency of the electrode for carriers. Therefore, combining the two aspects helps improve a short-circuit voltage and the photoelectric conversion efficiency of the solar cell.

Another embodiment of the present disclosure further provides a photovoltaic module, and the photovoltaic module is configured to convert received light energy into electric energy. FIG. 15 is a schematic diagram illustrating a structure of a photovoltaic module according to another embodiment of the present disclosure. It should be noted that, for parts the same as or corresponding to the foregoing embodiments, reference may be made to the corresponding description of the foregoing embodiments, and details are not described herein again.

Referring to FIG. 15, the photovoltaic module includes a cell string, formed by connecting a plurality of solar cells 40 according to any one of the foregoing embodiments, or formed by connecting a plurality of solar cells 40 produced by using the method for preparing the solar cell according to any one of the foregoing embodiments. The photovoltaic module includes an encapsulation glue film 41, configured to cover a surface of the cell string, and a cover plate 42, configured to cover a surface of the encapsulation glue film 41 facing away from the cell string. The solar cells 40 are electrically connected in a form of a whole slice or a plurality of slices to form a plurality of cell strings, and the plurality of cell strings are electrically connected in a series connection and/or parallel connection manner.

Specifically, in some embodiments, the plurality of cell strings are electrically connected through a conductive band 402. FIG. 15 shows merely a position relationship of solar cells. That is, arrangement directions of electrodes with a same polarity of cells are the same or electrodes including a positive polarity of cells are arranged toward a same side, so that the conductive band respectively connects different sides of two adjacent cells. In some embodiments, the cells may alternatively be arranged according to a sequence that electrodes with different polarities face toward a same side, that is, electrodes of a plurality of adjacent cells are sequentially sorted according to a sequence of a first polarity, a second polarity, and the first polarity, and the conductive band connects two adjacent cells on a same side.

In some embodiments, no interval is provided between the cells, that is, the cells are overlapped with each other.

In some embodiments, the encapsulation glue film 41 includes a first encapsulation layer and a second encapsulation layer, where the first encapsulation layer covers one of a front surface and a back surface of the solar cell 40, and the second encapsulation layer covers the other of the front surface and the back surface of the solar cell 40. Specifically, at least one of the first encapsulation layer and the second encapsulation layer may be an organic encapsulation glue film such as a polyvinyl butyral (PVB) glue film, an ethylene-vinyl acetate copolymer (EVA) glue film, a polyolefin elastomer (POE) glue film, or a polyethylene glycol terephthalate (PET) glue film.

In some cases, a boundary exists between the first encapsulation layer and the second encapsulation layer before lamination, and after the photovoltaic module is formed through lamination processing, concepts of the first encapsulation layer and the second encapsulation layer do not exist, that is, the first encapsulation layer and the second encapsulation layer have formed the entire encapsulation glue film 41.

In some embodiments, the cover plate 42 may be a cover plate with a light-transmitting function such as a glass cover plate or a plastic cover plate. Specifically, a surface of the cover plate 42 facing the encapsulation glue film 41 may be an uneven surface, to increase the utilization of incident light. The cover plate 42 includes a first cover plate and a second cover plate. The first cover plate is covered on a side of the first encapsulation layer facing away from the cell string, and the second cover plate is covered on a side of the second encapsulation layer facing away from the cell string.

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

A person of ordinary skill in the art may understand that, the foregoing implementations are specific embodiments for implementing the present disclosure. During actual application, various changes may be made to the forms and details without departing from the spirit and scope of the embodiments of the present disclosure. Any person skilled in the art may make various variations and modifications without departing from the spirit and scope of the embodiments of the present disclosure. Therefore, the protection scope of the embodiments of the present disclosure should be subject to a scope defined by the appended claims.

What is claimed is:

1. A solar cell, comprising:
an N-type silicon substrate having a front surface and a rear surface opposite to the front surface; wherein the front surface has a plurality of pyramid structures, and the rear surface has a plurality of grooves, at least one subset of the plurality of grooves being arranged sequentially along one arrangement direction;
a passivation layer, formed over the front surface;
a tunneling dielectric layer, formed on the rear surface; and
a doped conductive layer, formed over the tunneling dielectric layer;
wherein one respective groove of at least some of the plurality of grooves is recessed relative to the rear surface and has a bottom surface, a top opening opposite to the bottom surface, and a side wall located between the bottom surface and the top opening, and an area of an orthographic projection of the bottom surface of the one respective groove on the N-type silicon substrate is less than an area of an orthographic projection of the top opening of the one respective groove on the N-type silicon substrate; and
wherein an orthographic projection of each groove of the at least one subset of the plurality of grooves on the N-type silicon substrate is in a shape of a polygon with M sides, and M is a positive integer greater than or equal to 4.

2. The solar cell according to claim 1, wherein the plurality of grooves include N groove groups, any one groove group of the N groove groups includes grooves arranged sequentially in a corresponding arrangement direction, arrangement directions of some groove groups of the N groove groups are the same, while arrangement directions of some groove groups of the N groove groups are different, and N is a positive integer greater than or equal to 2.

3. The solar cell according to claim 2, wherein at least two first groove groups of the N groove groups are next to each other and spaced apart from each other by an interval, and at least two second groove groups of the N groove groups overlap with each other by an overlapping region.

4. The solar cell according to claim 1, wherein at least two first grooves of the plurality of grooves are next to each other and spaced apart from each other by an interval, and at least two second grooves of the plurality of grooves overlap with each other by an overlapping region.

5. The solar cell according to claim 1, wherein in a direction away from the rear surface, a single groove of the plurality of grooves includes a top opening, and a size of the top opening ranges from 1 μm to 20 μm in any one dimension.

6. The solar cell according to claim 1, wherein a distribution density of the plurality of grooves on the rear surface ranges from $1000/mm^2$ to $50000/mm^2$.

7. The solar cell according to claim 1, wherein in a direction away from the rear surface, a maximum value of a depth of a single groove of the plurality of grooves ranges from 50 nm to 2000 nm.

8. The solar cell according to claim 1, wherein the doped conductive layer includes N-type doping elements, and the doped conductive layer is formed over a surface of the tunneling dielectric layer facing away from the N-type silicon substrate.

9. The solar cell according to claim 1, wherein the doped conductive layer includes P-type doping elements, and the doped conductive layer is formed over a surface of the tunneling dielectric layer facing away from the N-type silicon substrate.

10. The solar cell according to claim 1, wherein the doped conductive layer includes a first part and a second part that are spaced apart, one of the first part and the second part includes doping elements of a same conductive type as that of the N-type silicon substrate, and the other of the first part and the second part includes doping elements of a conductive type different from that of the N-type silicon substrate.

11. A photovoltaic module comprising:
a cell string, formed by connecting a plurality of solar cells;
an encapsulation glue film, configured to cover a surface of the cell string; and
a cover plate, configured to cover a surface of the encapsulation glue film facing away from the cell string;
wherein each solar cell of the plurality of solar cells includes:
an N-type silicon substrate having a front surface and a rear surface opposite to the front surface; wherein the front surface has a plurality of pyramid structures, and the rear surface has a plurality of grooves, at least one subset of the plurality of grooves being arranged sequentially along one arrangement direction;
a passivation layer, formed over the front surface;
a tunneling dielectric layer, formed on the rear surface; and
a doped conductive layer, formed over the tunneling dielectric layer;
wherein one respective groove of at least some of the plurality of grooves is recessed relative to the rear surface and has a bottom surface, a top opening opposite to the bottom surface, and a side wall located between the bottom surface and the top opening, and an area of an orthographic projection of the bottom surface of the one respective groove on the N-type silicon substrate is less than an area of an orthographic projection of the top opening of the one respective groove on the N-type silicon substrate; and wherein an orthographic projection of each groove of the at least one subset of the plurality of grooves on the N-type silicon substrate is in a shape of a polygon with M sides, and M is a positive integer greater than or equal to 4.

* * * * *